United States Patent
Parikh et al.

(10) Patent No.: US 11,948,885 B2
(45) Date of Patent: *Apr. 2, 2024

(54) METHODS AND APPARATUS FOR FORMING DUAL METAL INTERCONNECTS

(71) Applicant: APPLIED MATERIALS, INC., Santa Clara, CA (US)

(72) Inventors: Suketu A. Parikh, San Jose, CA (US); Rong Tao, San Jose, CA (US); Roey Shaviv, Palo Alto, CA (US); Joung Joo Lee, San Jose, CA (US); Seshadri Ganguli, Sunnyvale, CA (US); Shirish Pethe, Cupertino, CA (US); David Gage, San Jose, CA (US); Jianshe Tang, San Jose, CA (US); Michael A Stolfi, Clifton Park, NY (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 439 days.

This patent is subject to a terminal disclaimer.

(21) Appl. No.: 17/356,717

(22) Filed: Jun. 24, 2021

(65) Prior Publication Data
US 2021/0320064 A1    Oct. 14, 2021

Related U.S. Application Data

(63) Continuation of application No. 16/516,817, filed on Jul. 19, 2019, now Pat. No. 11,075,165.

(51) Int. Cl.
*H01L 23/528*    (2006.01)
*H01L 21/02*    (2006.01)
(Continued)

(52) U.S. Cl.
CPC .... *H01L 23/5283* (2013.01); *H01L 21/02063* (2013.01); *H01L 21/32125* (2013.01);
(Continued)

(58) Field of Classification Search
None
See application file for complete search history.

(56) References Cited

U.S. PATENT DOCUMENTS

| 6,225,207 B1 | 5/2001 | Parikh |
| 7,750,472 B2 | 7/2010 | Kim et al. |
| (Continued) | | |

FOREIGN PATENT DOCUMENTS

WO    WO 02/39500 A2 *   5/2002   ........... H01L 21/768

OTHER PUBLICATIONS

International Search Report and Written Opinion for PCT/US2020/029099 dated Jul. 29, 2020.

*Primary Examiner* — Alexander G Ghyka
(74) *Attorney, Agent, or Firm* — MOSER TABOA (57) ABSTRACT

Methods and apparatus for creating a dual metal interconnect on a substrate. In some embodiments, a first liner of a first nitride material is deposited into at least one 1X feature and at least one wider than 1X feature, the first liner has a thickness of less than or equal to approximately 12 angstroms; a second liner of a first metal material is deposited into the at least one 1X feature and at least one wider than 1X feature; the first metal material is reflowed such that the at least one 1X feature is filled with the first metal material and the at least one wider than 1X feature remains unfilled with the first metal material; a second metal material is deposited on the first metal material, and the second metal material is reflowed such that the at least one wider than 1X feature is filled with the second metal material.

20 Claims, 9 Drawing Sheets

(51) Int. Cl.
    *H01L 21/321*     (2006.01)
    *H01L 21/67*     (2006.01)
    *H01L 21/768*     (2006.01)
    *H01L 23/522*     (2006.01)
    *H01L 23/532*     (2006.01)

(52) U.S. Cl.
    CPC .. *H01L 21/67207* (2013.01); *H01L 21/76814* (2013.01); *H01L 21/76816* (2013.01); *H01L 21/76831* (2013.01); *H01L 21/7684* (2013.01); *H01L 21/76843* (2013.01); *H01L 21/76871* (2013.01); *H01L 21/76879* (2013.01); *H01L 21/76882* (2013.01); *H01L 23/5226* (2013.01); *H01L 23/53209* (2013.01); *H01L 23/53223* (2013.01); *H01L 23/53233* (2013.01); *H01L 23/53238* (2013.01); *H01L 23/53252* (2013.01); *H01L 23/53266* (2013.01)

(56) References Cited

U.S. PATENT DOCUMENTS

| | | |
|---|---|---|
| 7,867,891 B2 | 1/2011 | O'Bien et al. |
| 8,779,589 B2 | 7/2014 | Simka et al. |
| 11,075,165 B2 * | 7/2021 | Parikh ............... H01L 21/76855 |
| 2005/0074966 A1 | 4/2005 | Rhodes |
| 2014/0284801 A1 | 9/2014 | Kitamura et al. |
| 2017/0092591 A1 | 3/2017 | Fu et al. |
| 2018/0122696 A1 | 5/2018 | Shaviv et al. |
| 2019/0198444 A1 | 6/2019 | Amanapu et al. |

* cited by examiner

METHODS AND APPARATUS FOR FORMING DUAL METAL INTERCONNECTS

RELATED APPLICATIONS

This application is a Continuation of and claims the benefit of U.S. patent application Ser. No. 16/516,817, filed Jul. 19, 2019 which is herein incorporated by reference in its entirety.

FIELD

Embodiments of the present principles generally relate to semiconductor processing.

BACKGROUND

Interconnects are used to electrically connect semiconductor devices on a substrate together. The interconnects may be constructed throughout multiple layers and connected between layers by vias. As the push for smaller and smaller form factors continues, the interconnects must also be scaled down to enable the smaller form factors of semiconductor devices. The inventors have found that using metal materials such as copper or aluminum in the scaled down interconnects leads to high electrical resistance in the interconnect. The high resistance leads to negative effects such as slowing down electrical signals and increasing RC constants in circuits. Accordingly, the inventors have provided improved methods and apparatus for decreasing the resistance interconnects.

SUMMARY

Methods and apparatus for increasing the performance of interconnects are provided herein.

In some embodiments, a method for creating a dual metal interconnect comprises depositing a first liner of a first nitride material into at least one 1X feature and at least one wider than 1X feature, the first liner has a thickness of less than or equal to approximately 12 angstroms, wherein X is a feature width greater than zero and less than or equal to approximately 17 nm; depositing a second liner of a first metal material into the at least one 1X feature and at least one wider than 1X feature; reflowing the first metal material such that the at least one 1X feature is filled with the first metal material and the at least one wider than 1X feature remains unfilled with the first metal material; depositing a second metal material on the first metal material; and reflowing the second metal material such that the at least one wider than 1X feature is filled with the second metal material.

In some embodiments, the method may further include polishing the second metal material; polishing the first metal material and the second metal material with an electrochemical balanced solution for dual metal polishing; and over polishing the first metal material and the second metal material with a corrosion inhibitor and pH control solution; pre-cleaning the at least one 1X feature and the at least one wider than 1X feature prior to depositing the first liner, depositing the first liner to a thickness of approximately 5 angstroms to approximately 12 angstroms, depositing the second liner to a thickness of approximately 40 angstroms to approximately 60 angstroms, reflowing the first metal material by depositing additional first metal material and performing a hydrogen gas anneal or by performing an anneal of the first metal material already deposited, depositing a second metal seed material on the first metal material prior to depositing the second metal material, the second metal seed material composed of at least the second metal material doped with manganese, depositing a third liner of a second nitride material into the at least one wider than 1X feature after reflowing the first metal material, the third liner has a thickness of approximately 5 angstroms to approximately 10 angstroms, performing electroplating of the second metal material instead of depositing and reflowing the second metal material, etching the first metal material in the at least one wider than 1X feature after reflowing the first metal material, depositing a third liner of a second nitride material after etching and without an air break after etching, wherein the first nitride material or the second nitride material is tantalum nitride or titanium nitride, wherein one of the at least one 1X feature has a height different from one of the at least one wider than 1X feature, wherein the first metal material is cobalt, ruthenium, molybdenum, nickel, rhodium, or iridium, and/or wherein the second metal material is copper or aluminum.

In some embodiments, an architecture for interconnecting structures on a substrate comprises at least one 1X feature formed with a first barrier layer with a thickness of approximately 5 angstroms to approximately 12 angstroms and filled with a conductive material having low diffusivity, high electromigration resistance, low scattering, and low resistivity at critical dimensions (CD) of approximately 15 nm or less, where X is a feature width greater than zero to approximately 15 nm and at least one 3X to 5X feature formed with the first barrier layer and the conductive material used in forming the at least one 1X feature and filled with a copper-based material with low resistivity.

In some embodiments, the architecture may further include wherein the first barrier layer is tantalum nitride or titanium nitride and the conductive material is cobalt, ruthenium, or molybdenum and/or wherein the at least one 3X to 5X feature has a second barrier layer formed by a tantalum nitride flash between the conductive material and the copper-based material, wherein the copper-based material is a copper manganese alloy.

In some embodiments, an integrated tool for performing semiconductor processing, the integrated tool comprises a set of chambers configured to perform a set of processes including: depositing a first liner of a first nitride material into at least one 1X feature and at least one wider than 1X feature, the first liner has a thickness of less than or equal to approximately 12 angstroms, wherein X is a feature width greater than zero and less than or equal to approximately 17 nm; depositing a second liner of a first metal material into the at least one 1X feature and at least one wider than 1X feature; reflowing the first metal material such that the at least one 1X feature is filled with the first metal material and the at least one wider than 1X feature remains unfilled with the first metal material; depositing a second metal material on the first metal material; and reflowing the second metal material such that the at least one wider than 1X feature is filled with the second metal material.

In some embodiments, the integrated tool may further comprise configurations to perform at least one additional process comprising pre-cleaning the at least one 1X feature and the at least one wider than 1X feature prior to depositing the first liner; depositing the first liner to a thickness of approximately 5 angstroms to approximately 12 angstroms; depositing the second liner to a thickness of approximately 40 angstroms to approximately 60 angstroms; reflowing the first metal material by depositing additional first metal material and performing a hydrogen gas anneal or by performing an anneal of the first metal material already deposited; depositing a second metal seed material on the first metal material prior to depositing the second metal material, the second metal seed material composed of at least the second metal material doped with manganese; depositing a third liner of a second nitride material into the at least one wider than 1X feature after reflowing the first metal material, the third liner has a thickness of approximately 5 angstroms to approximately 12 angstroms; and/or etching the first metal material in the at least one wider than 1X feature after reflowing the first metal material; or depositing a third liner of a second nitride material after etching and without an air break after etching.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus form dual metal interconnects with decreased resistance for the smallest semiconductor features (1X) such as interconnect lines and vias. By using more than one metal, the metal properties may be selected based on decreasing resistance for some geometries, electromigration, and/or barrier requirements. In some embodiments, the semiconductor process may utilize an integrated or cluster tool configured to form the dual metal interconnects on a substrate. As Moore's law requires geometries to shrink, copper is no longer the lowest resistance conductor for lines and vias due to barrier requirements and scattering in narrow features. In addition, copper cannot carry high current density due to electromigration failures. The inventors have found that utilizing cobalt, ruthenium, molybdenum, nickel, iridium, and/or rhodium may provide better conductive characteristics for small 1X features such as lines and vias. However, the inventors have also found that using such metals may lead to decreasing power line performance with up to 100% increase in resistance when changing from copper to cobalt or ruthenium for wider than 1X features (approximately 30 nm to approximately 100 nm wide features).

The inventors have discovered a process and apparatus for forming dual metal interconnects that increases the performance of 1X features such as lines and vias while maintaining the performance of features wider than 1X in size. In some embodiments, X is defined as a feature width greater than zero and less than or equal to approximately 17 nm. In some embodiments, X is defined as a feature width greater than zero and less than or equal to approximately 15 nm. A 2X feature will have a width of twice that of a 1X feature and so on. In some embodiments, a limitation is placed such that a next larger feature size wider than the 1X feature is at least 2X or larger. In some embodiments, the larger feature size wider than 1X feature, is limited to 2X to 5X. In some embodiments, the larger feature size wider than 1X feature, is limited to 3X to 5X.

In some embodiments, narrow lines and vias are filled with cobalt, ruthenium, molybdenum, nickel, iridium, and/or rhodium with an ultra-thin liner of nitride (approximately 12 angstroms or less). The inventors have found that the conductive material for 1X features should have low diffusivity, high electromigration resistance, low scattering (provides low resistivity at narrow critical dimensions), and low resistivity at critical dimensions (CD). Wide lines such as power lines are filled with a different metal such as copper, copper manganese, or aluminum copper alloy and the like and may have a second, or dual barrier liner layer between the cobalt, ruthenium, molybdenum, nickel, iridium, and/or rhodium material layer. The inventors have found that the conductive material for wider than 1X features should have low bulk resistivity—higher scattering and hence low resistivity at wider CDs. The conductive materials for wider than 1X features generally have low melting points, higher diffusivity, and low electromigration resistance—such as copper-based materials and aluminum-based materials.

In some embodiments, a low cost wide mask may be used to create deeper trenches for wide lines, allowing height differences between the 1X features and the wider than 1X features on a substrate. In some embodiments, a chemical mechanical polish (CMP) is used simultaneously with in situ thickness control, optimization of pH, and/or corrosion inhibitor to prevent galvanic corrosion of the dual metal interconnects during the polishing process. The dual metal interconnects beneficially provide the lowest line resistance and via resistance for narrow features (1X features), improved electromigration, and/or time-dependent dielectric breakdown (TDDB) for cobalt, ruthenium, molybdenum, nickel, iridium, and/or rhodium. The dual metal interconnects also provide improved wide line (wider than 1X) resistance (e.g., power line resistance) by incorporating a low resistance metal, yielding only a 1.1 times increase in wide line resistance as opposed to a two times increase in resistance when using only cobalt, ruthenium, molybdenum, nickel, iridium, and/or rhodium and the like. In addition, another benefit is the forming of the dual metal interconnects with minimal increases in process steps over single metal interconnects. In some embodiments, the dual metal interconnects allow for easy polishing of materials such as cobalt, ruthenium, molybdenum, nickel, iridium, and/or rhodium with standard copper overburden.

Figure 1:
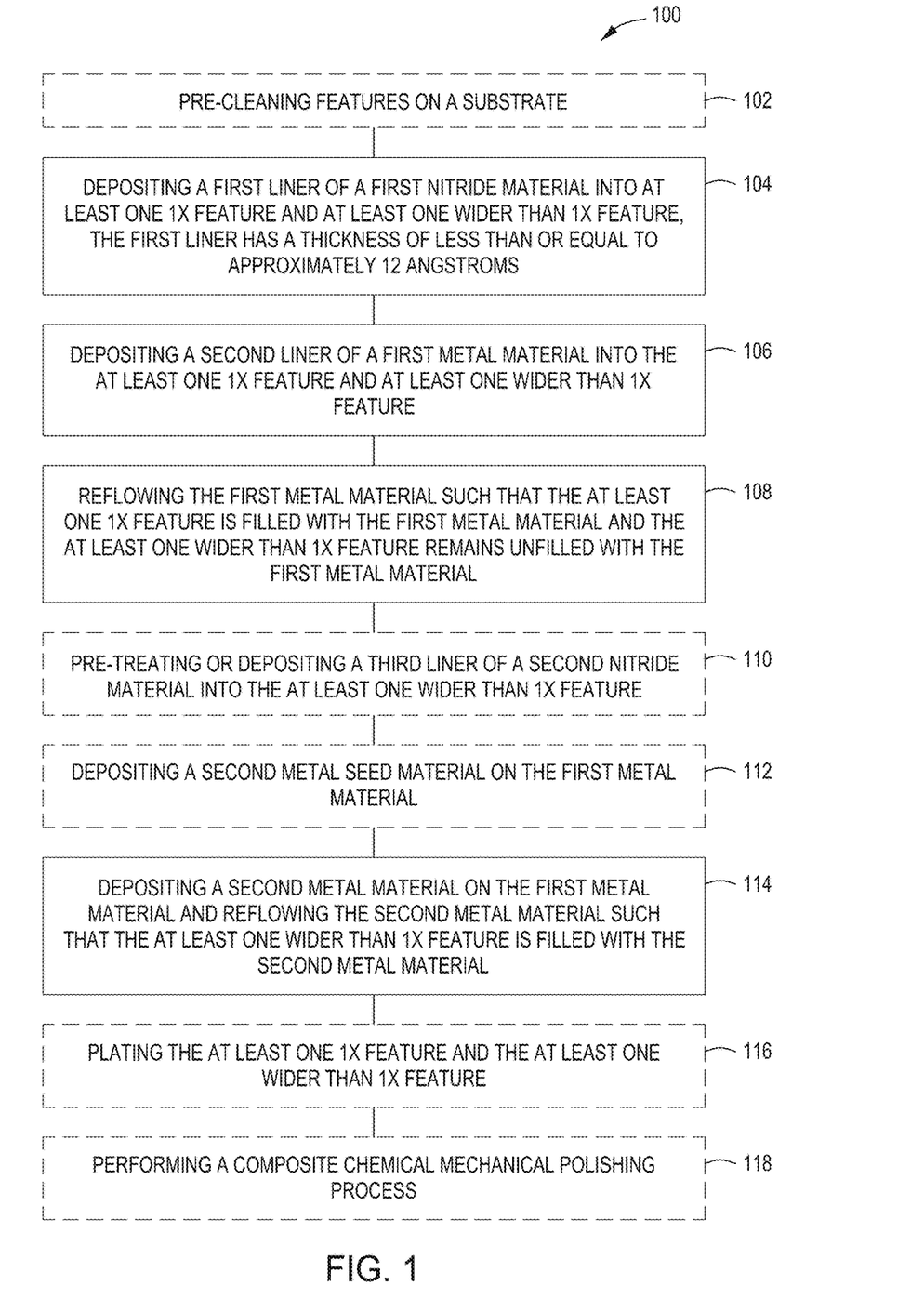
FIG. 1 is a method of forming dual metal interconnects in accordance with some embodiments of the present principles.
Figure 4:
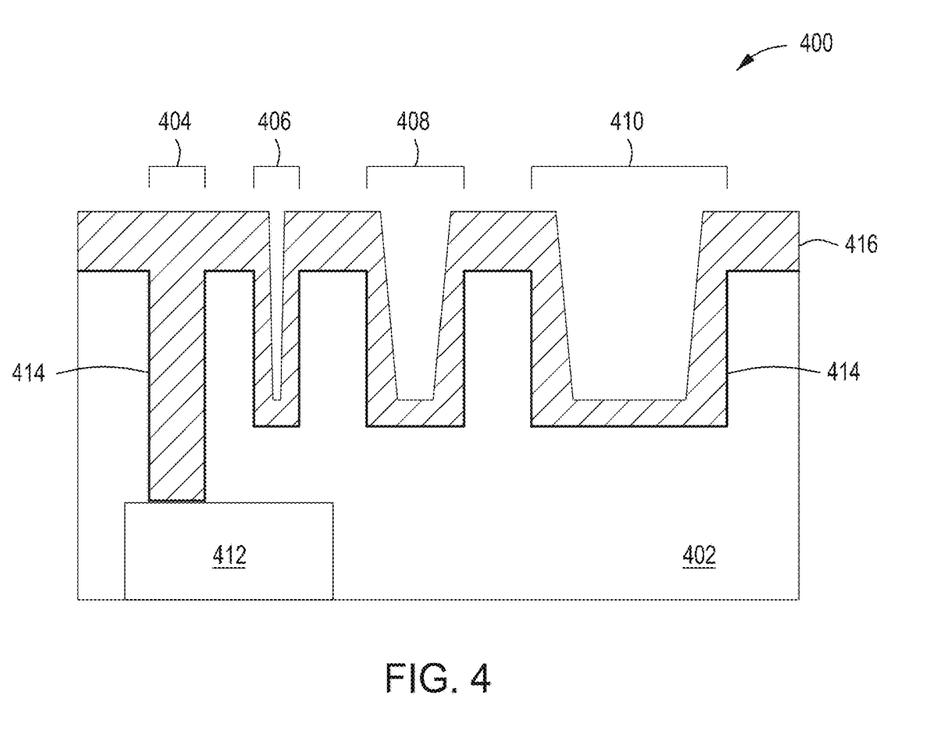
FIG. 4 is a cross-sectional view of a dual metal interconnect with a first liner and a second liner in accordance with some embodiments of the present principles.

FIG. 1 is a method 100 of forming dual metal interconnects in accordance with some embodiments. FIG. 4 illustrates 1X features 404, 406 and wider than 1X features 408, 410 formed in a substrate 402 in a cross-sectional view 400. A first 1X feature 404 is a via that connects to an embedded interconnect 412. After the features 404-410 are formed on the substrate 402, in some embodiments, in block 102 of the method 100, the features may be optionally cleaned in a pre-cleaning process performed in a pre-clean chamber of an integrated tool (see, e.g., FIG. 14). The pre-cleaning process helps to remove any particles and/or oxidation that may occur on the substrate surface and/or in the features 404-410 or underlying interconnects 412. In block 104, a first liner 414 of a first nitride material is deposited into at least one 1X feature 404, 406 and at least one wider than 1X feature 408, 410. The first liner 414 has a thickness of less than or equal to approximately 12 angstroms. In some embodiments, the first liner 414 has a thickness of approximately 5 angstroms to approximately 10 angstroms. In some embodiments, the first liner 414 has a thickness of approximately 5 angstroms to approximately 12 angstroms. The first liner 414 may be deposited using an atomic layer deposition (ALD) process in an ALD chamber of an integrated tool (see, e.g., FIG. 14). The first liner 414 may be used as a barrier liner to prevent migration of subsequent deposition metals from migrating into the dielectric material of the substrate 402. The subsequently deposited metals on the first liner 414 are not easily diffused in the dielectric of the substrate and, in some embodiments, an ultra-thin barrier layer of less than or equal to approximately 12 angstroms may be formed in the features. In some embodiments, the first nitride material may be tantalum nitride (TaN) or titanium nitride (TiN) depending on which metal materials will be subsequently deposited.

In block 106, a second liner 416 of a first metal material is deposited into the at least one 1X feature 404, 406 and at least one wider than 1X feature 408, 410. The deposition process may be performed in a chemical vapor deposition (CVD) process in a CVD chamber of an integrated tool (see, e.g., FIG. 14). In some embodiments, the first metal material may be cobalt, ruthenium, molybdenum, nickel, iridium, or rhodium. In block 108, the first metal material 502 is reflowed such that the at least one 1X feature 404, 406 is filled with the first metal material 502 and the at least one wider than 1X feature 408, 410 remains unfilled with the first metal material 502 as illustrated in the cross-sectional view 500 of FIG. 5. The reflow process may be performed in a plasma vapor deposition (PVD) chamber of an integrated tool (see, e.g., FIG. 14). In some embodiments, the reflow process may include depositing additional first metal material to ensure that the reflow process fills the 1X features 404, 406. In some embodiments, a reflow or annealing process may use hydrogen plasma.

Figure 5:
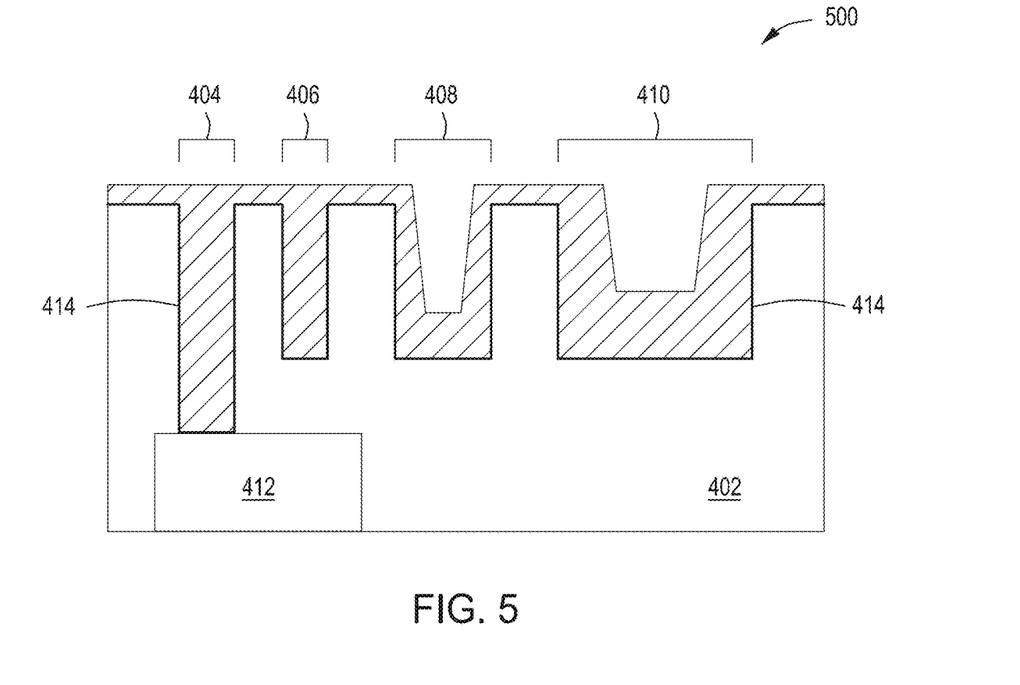
FIG. 5 is a cross-sectional view of a dual metal interconnect after reflowing of the second liner in accordance with some embodiments of the present principles.

Cobalt diffusion into a dielectric with high carbon content is slower compared to copper. In some embodiments, when high carbon, low K materials (e.g., SiOC) are used for the dielectric, a reduced barrier thickness is obtained for 1X features such as narrow line and via features filled with cobalt. The inventors have found that to prevent migration of subsequently deposited copper material, one of two alternative processes may be used to prevent the copper from migrating into the dielectric: 1) a second nitride material may be deposited on the first metal material 502 prior to any copper deposition or 2) the copper may be doped with manganese which migrates through the cobalt material and reinforces the first liner 414.

Figure 9:
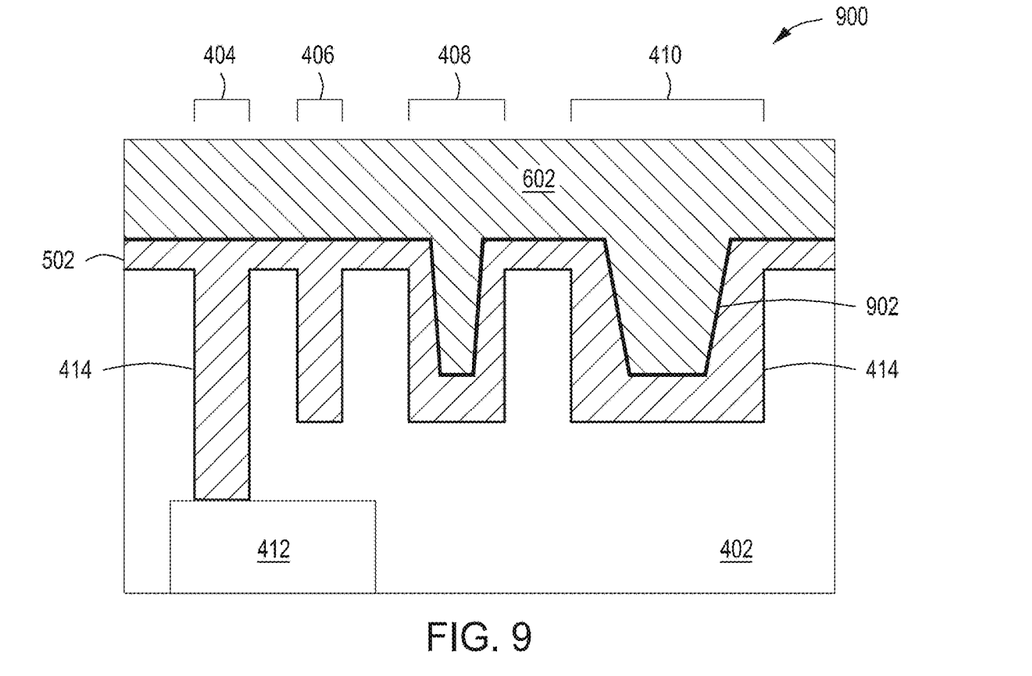
FIG. 9 is a cross-sectional view of a dual metal interconnect with a third liner between the first metal material and the second metal material in accordance with some embodiments of the present principles.

In block 110 of method 100, in some embodiments incorporating the first alternative process, an optional pre-treating process or deposition process of a third liner 902 shown in the cross-sectional view 900 of FIG. 9 of a second nitride material into at least one of the at least one wider than 1X feature 408, 410. The processes may be performed in an ALD chamber of an integrated tool (see, e.g., FIG. 14). In some embodiments, the second nitride material may have a thickness of approximately 12 angstroms or less. In some embodiments the second nitride material may have a thickness of approximately 5 angstroms to approximately 10 angstroms. In some embodiments the second nitride material may have a thickness of approximately 5 angstroms to approximately 12 angstroms. In some embodiments, the second nitride material may be tantalum nitride (TaN) or titanium nitride (TiN) depending on the metals deposited in the features. In some embodiments, the second nitride material may be deposited by a flash enhanced ALD (FE-ALD) process. The second nitride material works in conjunction with the first nitride material to provide a dual barrier to prevent migration of the second metal material into the dielectric material of the substrate 402. By using a dual barrier, each barrier may be made ultra-thin (e.g., less than or equal to approximately 12 angstroms thick).

Figure 10:
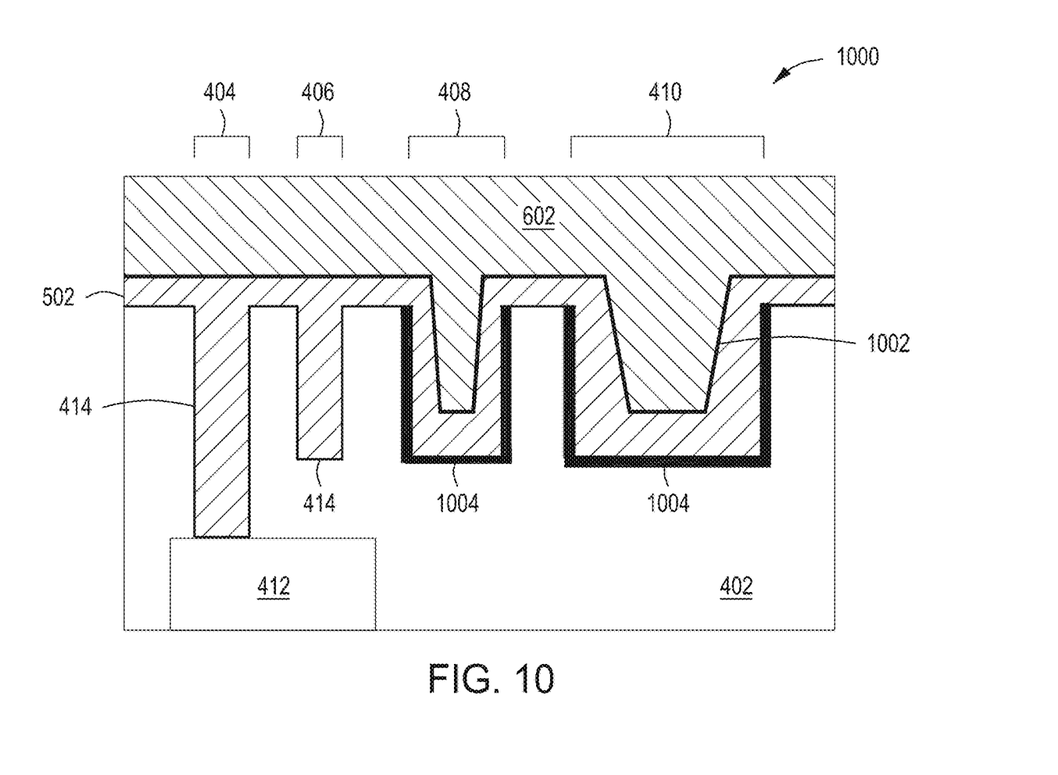
FIG. 10 is a cross-sectional view of a dual metal interconnect with a second metal seed material between the first metal material and the second metal material in accordance with some embodiments of the present principles.

In block 112 of method 100, in some embodiments incorporating the second alternative process, an optional process of depositing a second metal seed material 1002 as illustrated in the cross-sectional view 1000 of FIG. 10 into the at least one wider than 1X features 408, 410 on the first metal material may occur. The second metal seed material 1002 helps to form a barrier layer to prevent migration of the second metal through the first metal and into the dielectric of the substrate 402. In some embodiments, the second metal seed material 1002 may be copper doped with manganese. The manganese will migrate through the first metal to the first liner 414 and create a diffusion barrier layer 1004 in at least the walls of the at least one wider than 1X features 408, 410 (as illustrated) to block migration of the copper in the at least one wider than 1X features 408, 410 into the dielectric of the substrate. The copper manganese migrates through the first metal material 502 to the first liner 414 and creates the diffusion barrier layer 1004 composed of magnesium silicon oxide ($MnSiO_2$) for dielectrics composed of SiOC. In some embodiments, the third liner 902 of block 110 or the second metal seed material 1002 of block 112 may be formed on the first metal depending on the interaction between a first metal material and a second metal material.

Figure 6:
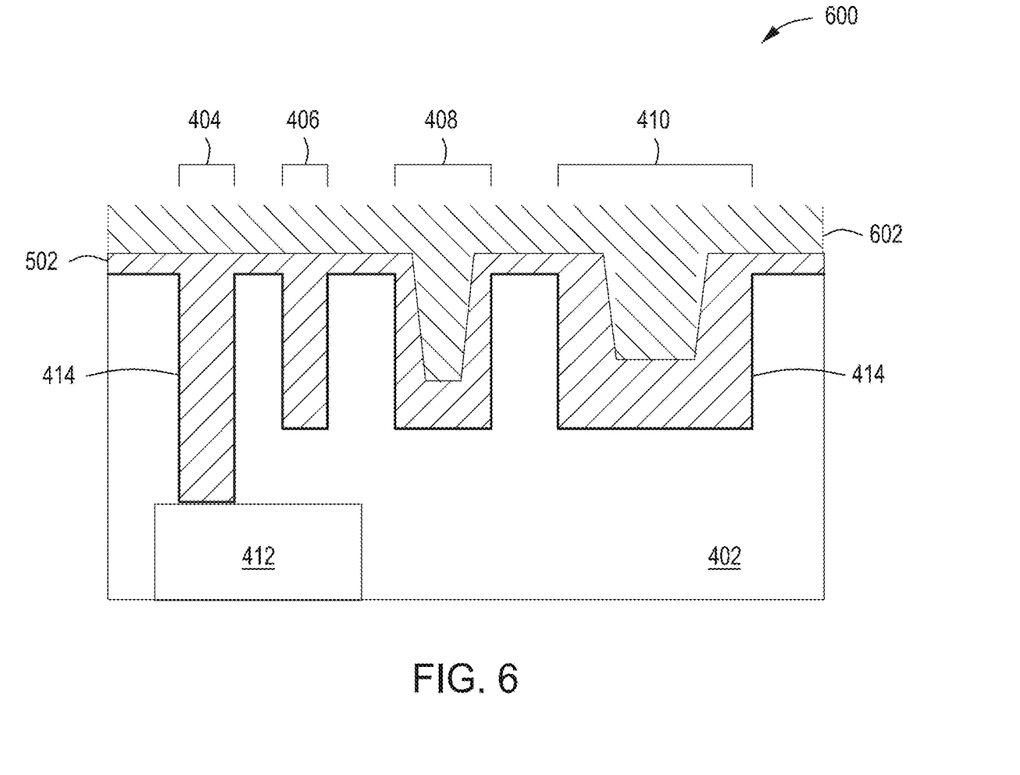
FIG. 6 is a cross-sectional view of a dual metal interconnect after deposition of a second metal material in accordance with some embodiments of the present principles.
Figure 7:
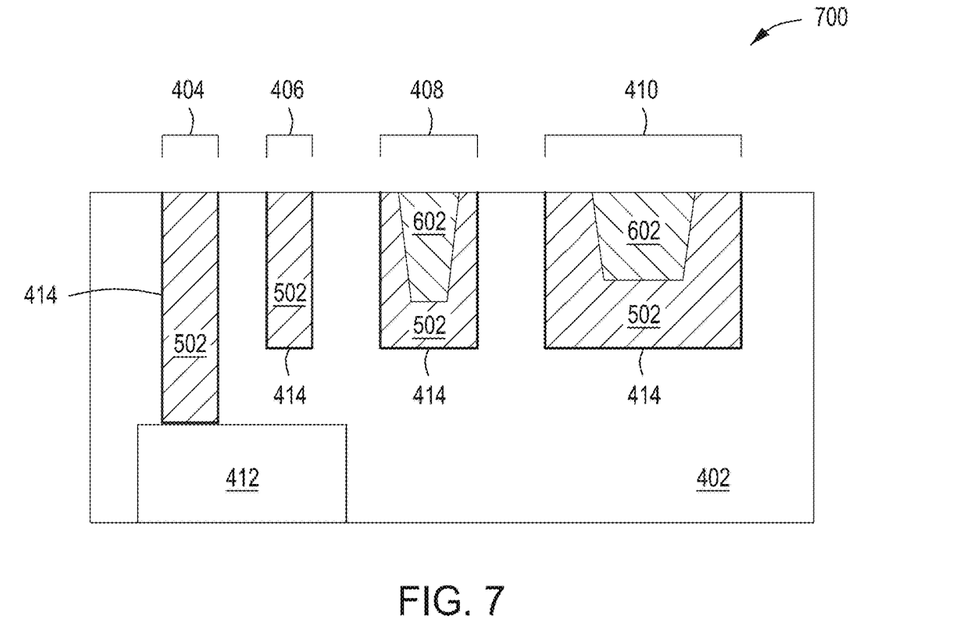
FIG. 7 is a cross-sectional view of a dual metal interconnect after chemical mechanical polishing (CMP) in accordance with some embodiments of the present principles.

In block 114 of method 100, a second metal material 602 is deposited on the first metal material 502 (or second nitride material or second metal seed material 1002) and the second metal material 602 is reflowed such that the at least one wider than 1X feature 408, 410 is filled with the second metal material 602 as illustrated in the cross-sectional view 600 of FIG. 6. In block 116 of method 100, in some embodiments, the at least one 1X feature 404, 406 and the at least one wider than 1X feature 408, 410 are optionally electro-plated with the second metal material. In block 118 of the method 100, in some embodiments, an optional composite chemical mechanical polish (CMP) is performed on the at least one 1X feature 404, 406 and the at least one wider than 1X feature 408, 410 as illustrated in view 700 of FIG. 7 to remove overburden and expose the 1X 404, 406 and wider than 1X features 408, 410. In some embodiments, the polishing process is a three part process discussed in detail for FIG. 3.

Figure 2:
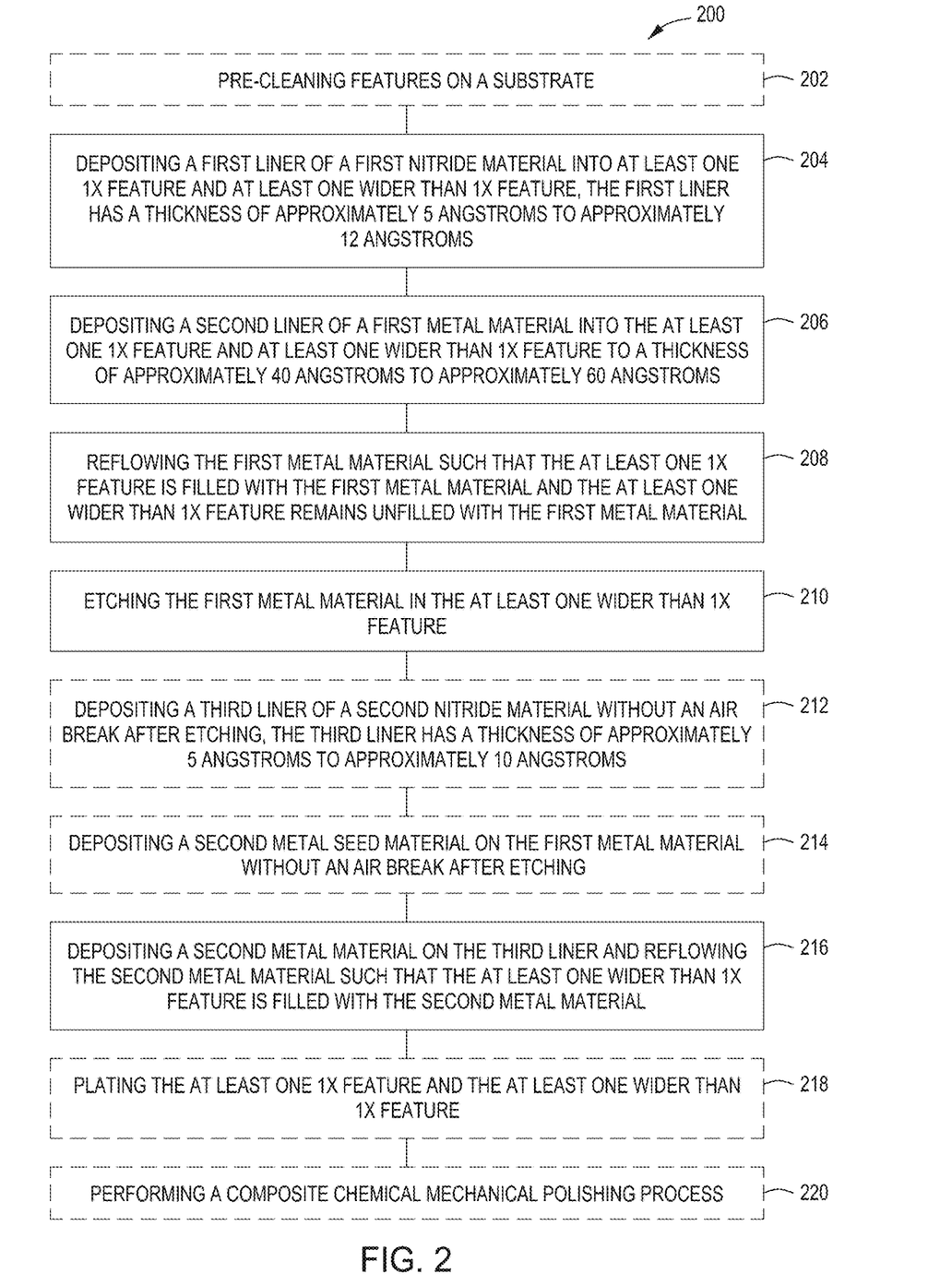
FIG. 2 is a method of forming dual metal interconnects with an etching process in accordance with some embodiments of the present principles.

FIG. 2 is a method 200 of forming dual metal interconnects with an etching process in accordance with some embodiments. FIG. 4 illustrates 1X features 404, 406 and wider than 1X features 408, 410 formed in a substrate 402 in a cross-sectional view 400. A first 1X feature 404 is a via that connects to an embedded interconnect 412. After the features 404-410 are formed on the substrate 402, in some embodiments, in block 202 of the method 200, the features may be optionally cleaned in a pre-cleaning process performed in a pre-clean chamber of an integrated tool (see, e.g., FIG. 14). The pre-cleaning process helps to remove any particles and/or oxidation that may occur on the substrate surface and/or in the features 404-410 or underlying interconnects 412. In block 204, a first liner 414 of a first nitride material is deposited into at least one 1X feature 404, 406 and at least one wider than 1X feature 408, 410. In some embodiments, the first liner 414 has a thickness of approximately 12 angstroms or less. In some embodiments, the first liner 414 has a thickness of approximately 5 angstroms to approximately 10 angstroms. In some embodiments, the first liner 414 has a thickness of approximately 5 angstroms to approximately 12 angstroms. The first liner 414 may be deposited using an atomic layer deposition (ALD) process in an ALD chamber of an integrated tool (see, e.g., FIG. 14). The first liner 414 may be used as a barrier liner to prevent migration of subsequent deposition metals from migrating into the dielectric material of the substrate 402. In some embodiments, the first nitride material may be tantalum nitride (TaN) or titanium nitride (TiN) depending on which metal materials will be subsequently deposited.

Figure 8:
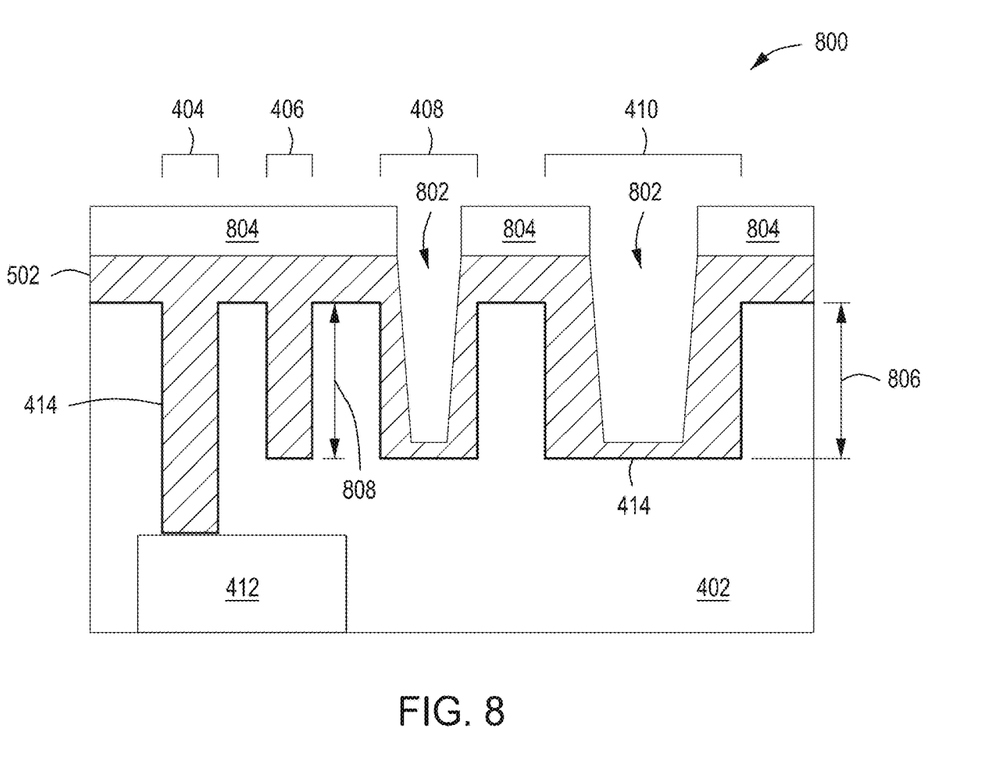
FIG. 8 is a cross-sectional view of a dual metal interconnect after etching of the second liner in the wider than 1X features in accordance with some embodiments of the present principles.

In block 206, a second liner 416 of a first metal material with a thickness of approximately 40 angstroms to approximately 60 angstroms is deposited into the at least one 1X feature 404, 406 and at least one wider than 1X feature 408, 410. The deposition process may be performed in a chemical vapor deposition (CVD) in a CVD chamber of an integrated tool (see, e.g., FIG. 14). The first metal material may be cobalt, ruthenium, molybdenum, nickel, iridium, or rhodium. In block 208, the first metal material 502 is reflowed such that the at least one 1X feature 404, 406 is filled with the first metal material 502 and the at least one wider than 1X feature 408, 410 remains unfilled with the first metal material 502 as illustrated in the cross-sectional view 500 of FIG. 5. The reflow process may be performed in a plasma vapor deposition (PVD) chamber of an integrated tool (see, e.g., FIG. 14). In some embodiments, the reflow process may include depositing additional first metal material to ensure that the reflow process fills the 1X features 404, 406. In block 210, the first metal material is etched 802 in the at least one wider than 1X feature 406, 408 as illustrated in a view 800 of FIG. 8. In some embodiments, the etching is performed by using a mask 804 to protect features not to be etched such as the 1X features 404, 406. The inventors have found that the etching of the first metal material 502 allows for more second metal material to be filled into the at least one wider than 1X feature 408, 410 and subsequently reducing the resistivity of the feature such as a power line. In some embodiments, the etching process may be a dry etching process. In some embodiments, the etching process may also be used to increase a height 806 of a wider than 1X feature 408, 410 different from a height 808 of a 1X feature to provide better performance (e.g., higher current density, less resistance, etc.).

In block 212, in some embodiments incorporating the first alternative process, an optional process of depositing a third liner 902 shown in the cross-sectional view 900 of FIG. 9 of a second nitride material without an air break from the etching process into the at least one wider than 1X feature 408, 410 to a thickness of approximately 5 angstroms to approximately 10 angstroms. The processes may be performed in an ALD chamber of an integrated tool (see, e.g., FIG. 14). In some embodiments, the second nitride material may be tantalum nitride (TaN) or titanium nitride (TiN) depending on the metals deposited in the features. In some embodiments, the second nitride material may be deposited by a flash enhanced ALD (FEALD) process. The second nitride material works in conjunction with the first nitride material to provide a dual barrier to prevent migration of the second metal material into the dielectric material of the substrate 402. By using a dual barrier, each barrier may be made ultra-thin (e.g., less than or equal to approximately 12 angstroms thick).

In block 214 of method 200, in some embodiments incorporating the second alternative process, an optional process of depositing a second metal seed material 1002 as illustrated in the cross-sectional view 1000 of FIG. 10 without an air break from the etching process into the at least one wider than 1X features 408, 410 on the first metal material may occur. The second metal seed material 1002 helps to form a barrier layer to prevent migration of the second metal through the first metal and into the dielectric of the substrate 402. In some embodiments, the second metal seed material 1002 may be copper doped with manganese. The manganese will migrate through the first metal to the first liner 414 and create a diffusion barrier layer 1004 in at least the walls of the at least one wider than 1X features 408, 410 (as illustrated) to block migration of the copper into the dielectric of the substrate. The copper manganese migrates through the first metal material 502 in the at least one wider than 1X features 408, 410 to the first liner 414 and creates the diffusion barrier layer 1004 composed of magnesium silicon oxide ($MnSiO_2$) for dielectrics composed of SiOC. In some embodiments, the third liner 902 of block 212 or the second metal seed material 1002 of block 214 may be formed on the first metal depending on the interaction between a first metal and a second metal.

In block 216 of method 200, a second metal material is deposited on the first metal material (or second nitride material or second metal seed material 1002) and the second metal material 602 is reflowed such that the at least one wider than 1X feature 408, 410 is filled with the second metal material 602 as illustrated in the cross-sectional view 600 of FIG. 6. In block 218 of method 200, in some embodiments, the at least one 1X feature 404, 406 and the at least one wider than 1X feature 408, 410 are optionally electro-plated with the second metal. In block 220 of the method 200, in some embodiments, an optional composite chemical mechanical polish (CMP) is performed on the at least one 1X feature 404, 406 and the at least one wider than 1X feature 408, 410 as illustrated in view 700 of FIG. 7 to remove overburden and expose the 1X 404, 406 and wider than 1X features 408, 410. In some embodiments, the polishing process is a three part process discussed in detail for FIG. 3.

Figure 3:
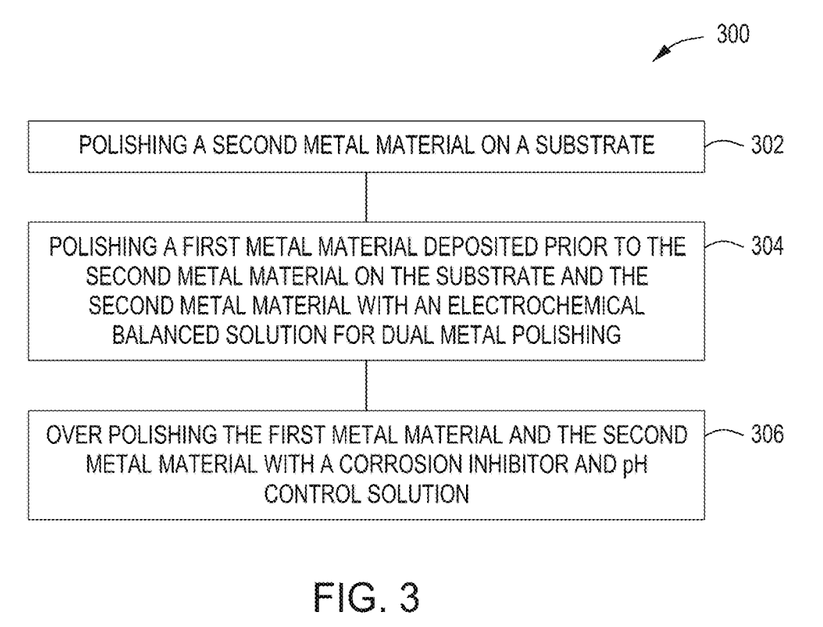
FIG. 3 is a method of polishing a dual metal interconnect in accordance with some embodiments of the present principles.
Figure 11:
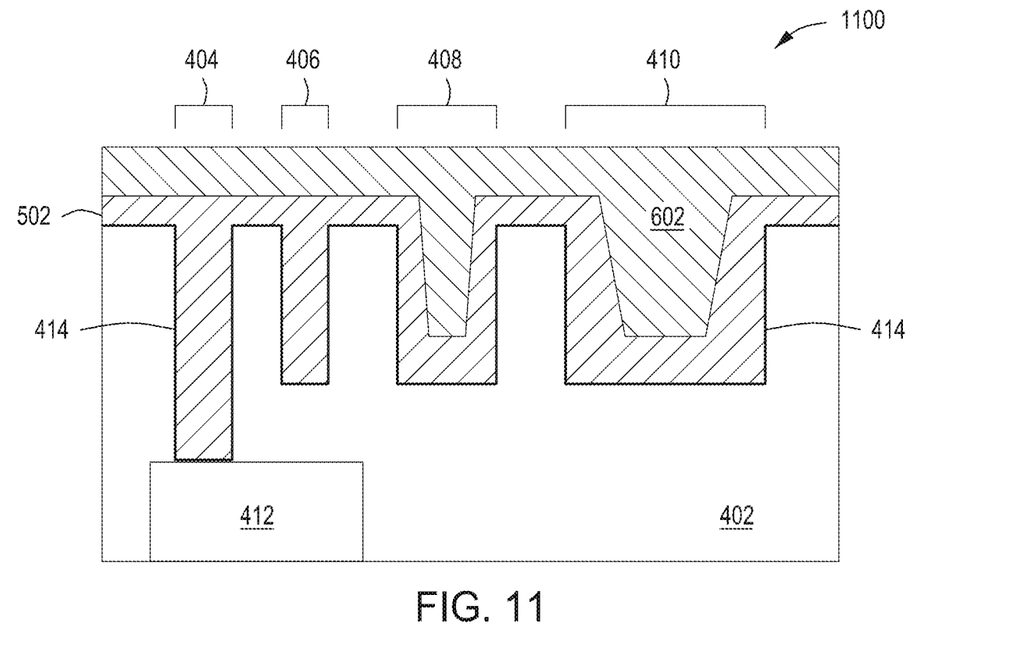
FIG. 11 is a cross-sectional view of a dual metal interconnect after a first polish process in accordance with some embodiments of the present principles.
Figure 12:
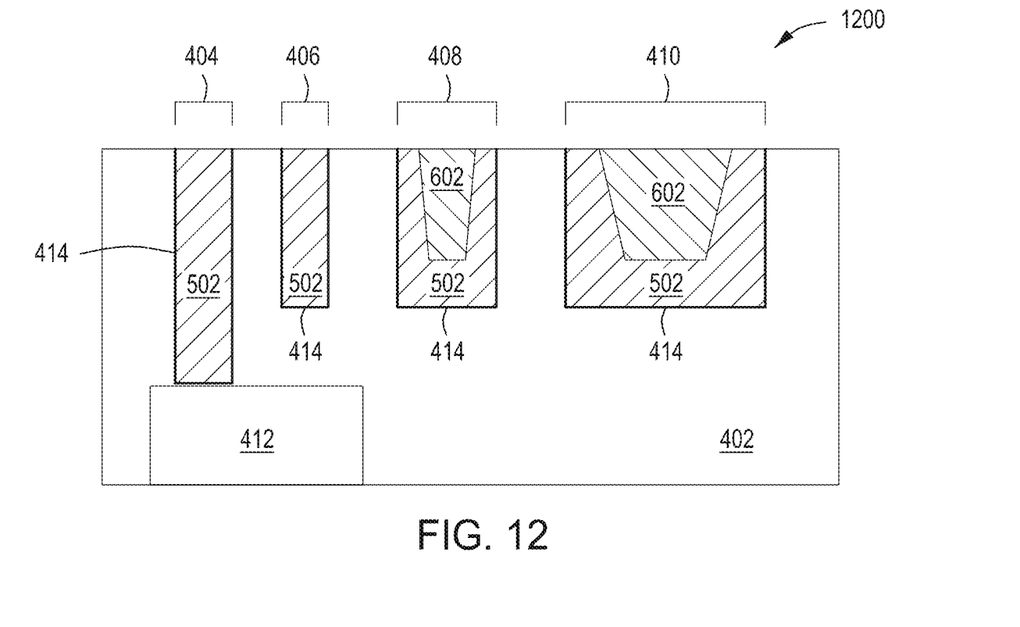
FIG. 12 is a cross-sectional view of a dual metal interconnect after a second polish process in accordance with some embodiments of the present principles.
Figure 13:
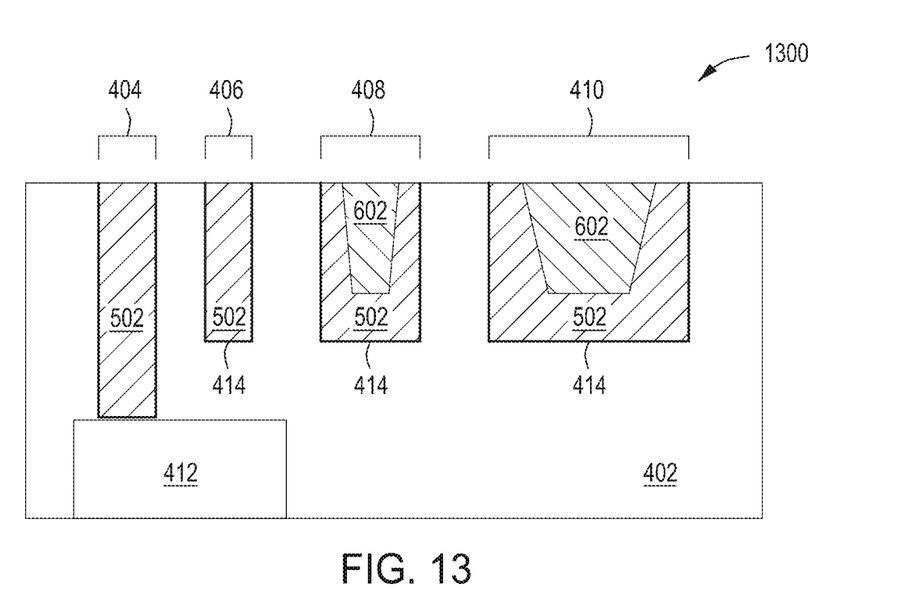
FIG. 13 is a cross-sectional view of a dual metal interconnect after a third polish process in accordance with some embodiments of the present principles.

FIG. 3 is a method 300 of polishing a dual metal interconnect in accordance with some embodiments. In block 302, a second metal material is polished in a CMP chamber. The polishing is sufficient to remove a majority of the second metal material without reaching the first metal material as illustrated in the cross-sectional view 1100 of FIG. 11. In block 304, a first metal material deposited prior to the second metal material on the substrate and the second metal material are polished with an electro-chemical balanced solution for dual metal polishing as illustrated in the cross-sectional view 1200 of FIG. 12. The dual metal polishing removes any remaining overburden left after the second metal polishing in block 302. In block 306, the first metal material and the second metal material are over polished with a corrosion inhibitor and/or pH control solution to further polish the dual metal interconnect surfaces as illustrated in the cross-sectional view 1300 of FIG. 13. The over polish process helps to remove residue and to buff the surfaces.

Figure 14:
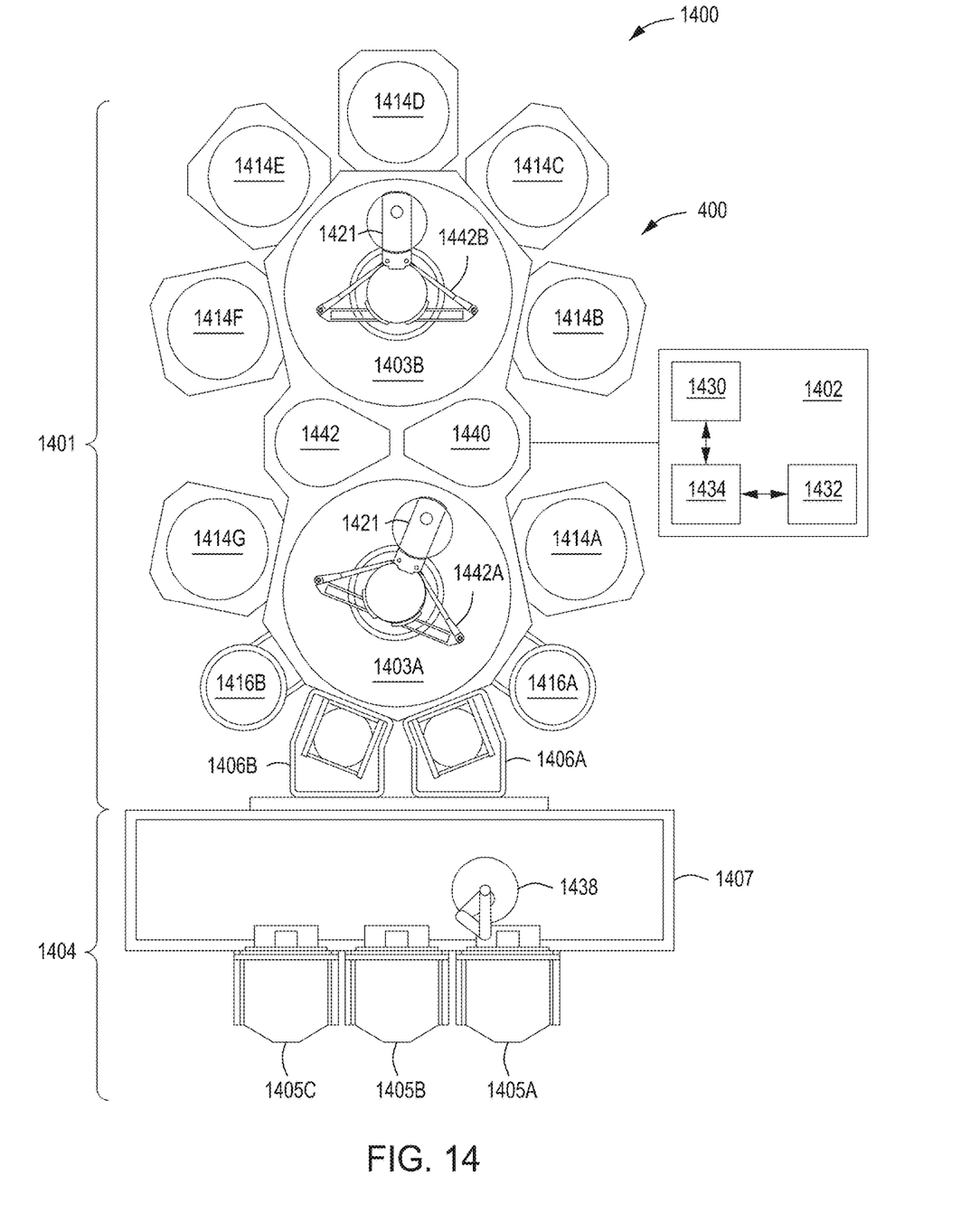
FIG. 14 is a top-down view of an integrated tool that may be used to form a dual metal interconnect in accordance with some embodiments of the present principles.

FIG. 14 is a top-down view of an integrated tool that may be used to form a dual metal interconnect in accordance with some embodiments. As noted above, the methods described herein may be performed in individual process chambers that may be provided in a standalone configuration (e.g., ex situ CMP processing) or as part of a cluster tool (e.g., in situ CMP processing), for example, an integrated tool 1400 (i.e., cluster tool) described below with respect to FIG. 14. The advantage of using an integrated tool 1400 is that there is no vacuum break (no exposure to the environment or air break) and no substantial process lag before processing or treatment between various chambers required for the above methods. Examples of the integrated tool 1400 include the ENDURA® integrated tools, available from Applied Materials, Inc., of Santa Clara, California. However, the methods described herein may be practiced using other cluster tools having suitable process chambers, or in other suitable process chambers. For example, in some embodiments the inventive methods discussed above may advantageously be performed in an integrated tool such that there are limited or no vacuum breaks between processes. For example, reduced vacuum breaks may limit or prevent contamination (oxidation) of the substrate after the etching processes.

The integrated tool 1400 includes a vacuum-tight processing platform 1401, a factory interface 1404, and a system controller 1402. The processing platform 1401 comprises multiple processing chambers, such as 1414A, 1414B, 1414C, 1414D, 1414E, and 1414F operatively coupled to a vacuum substrate transfer chamber (transfer chambers 1403A, 1403B). The factory interface 1404 is operatively coupled to the transfer chamber 1403A by one or more load lock chambers (two load lock chambers, such as 1406A and 1406B shown in FIG. 14).

In some embodiments, the factory interface 1404 comprises at least one docking station 1407, at least one factory interface robot 1438 to facilitate the transfer of the semiconductor substrates. The at least one docking station 1407 is configured to accept one or more front opening unified pod (FOUP). Three FOUPS, such as 1405A, 1405B, and 1405C are shown in the embodiment of FIG. 14. The at least one factory interface robot 1438 is configured to transfer the substrates from the factory interface 1404 to the processing platform 1401 through the load lock chambers, such as 1406A and 1406B. Each of the load lock chambers 1406A and 1406B have a first port coupled to the factory interface 1404 and a second port coupled to the transfer chamber 1403A. The load lock chamber 1406A and 1406B are coupled to a pressure control system (not shown) which pumps down and vents the load lock chambers 1406A and 1406B to facilitate passing the substrates between the vacuum environment of the transfer chamber 1403A and the substantially ambient (e.g., atmospheric) environment of the factory interface 1404. The transfer chambers 1403A, 1403B have vacuum robots 1442A, 1442B disposed in the respective transfer chambers 1403A, 1403B. The vacuum robot 1442A is capable of transferring substrates 1421 between the load lock chamber 1406A, 1406B, the processing chambers 1414A and 1414F and a cool down station 1440 or a pre-clean station 1442. The vacuum robot 1442B is capable of transferring substrates 1421 between the cool down station 1440 or pre-clean station 1442 and the processing chambers 1414B, 1414C, 1414D, and 1414E.

In some embodiments, the processing chambers 1414A, 1414B, 1414C, 1414D, 1414E, and 1414F are coupled to the transfer chambers 1403A, 1403B. The processing chambers 1414A, 1414B, 1414C, 1414D, 1414E, 1414F, and 1414G comprise at least an atomic layer deposition (ALD) process chamber, a chemical vapor deposition (CVD) process chamber, and a physical vapor deposition (PVD) process chamber. Other chambers may be incorporated such as chemical mechanical polishing (CMP) chambers, annealing chambers, additional ALD chambers, additional CVD process chambers, and/or additional PVD chambers or the like. ALD, PVD, CVD, and CMP chambers may include any chambers suitable to perform all or portions of the methods described herein, as discussed above.

In some embodiments, one or more optional service chambers (shown as 1416A and 1416B) may be coupled to the transfer chamber 1403A. The service chambers 1416A and 1416B may be configured to perform other substrate processes, such as degassing, orientation, substrate metrology, cool down and the like.

The system controller 1402 controls the operation of the tool 1400 using a direct control of the process chambers 1414A, 1414B, 1414C, 1414D, 1414E, and 1414F or alternatively, by controlling the computers (or controllers) associated with the process chambers 1414A, 1414B, 1414C, 1414D, 1414E, 1414F, 1414G and the tool 1400. In operation, the system controller 1402 enables data collection and feedback from the respective chambers and systems to optimize performance of the tool 1400. The system controller 1402 generally includes a Central Processing Unit (CPU) 1430, a memory 1434, and a support circuit 1432. The CPU 1430 may be any form of a general purpose computer processor that can be used in an industrial setting. The support circuit 1432 is conventionally coupled to the CPU 1430 and may comprise a cache, clock circuits, input/output subsystems, power supplies, and the like. Software routines, such as a method as described above may be stored in the memory 1434 and, when executed by the CPU 1430, transform the CPU 1430 into a specific purpose computer (system controller 1402). The software routines may also be stored and/or executed by a second controller (not shown) that is located remotely from the tool 1400.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An integrated tool for performing semiconductor processing, the integrated tool, comprising:
    a set of process chambers of the integrated tool that are interconnected under vacuum and configured to perform a set of processes of a method for creating a dual metal interconnect, the method including:
        depositing a first liner of a first nitride material into at least one 1X feature and at least one wider than 1X feature, the first liner has a thickness of less than or equal to approximately 12 angstroms, wherein X is a minimum feature width;
        depositing a second liner of a first metal material into the at least one 1X feature and at least one wider than 1X feature;
        reflowing the first metal material such that the at least one 1X feature is filled with the first metal material and the at least one wider than 1X feature remains partially filled;
        depositing a second metal material on the first metal material; and
        reflowing the second metal material such that the at least one wider than 1X feature is filled with the second metal material.

2. The integrated tool of claim 1, the method further comprising:
    polishing the second metal material;
    polishing the first metal material and the second metal material with an electro-chemical balanced solution for dual metal polishing; and
    over polishing the first metal material and the second metal material with a corrosion inhibitor and pH control solution.

3. The integrated tool of claim 1, the method further comprising:
    pre-cleaning the at least one 1X feature and the at least one wider than 1X feature prior to depositing the first liner.

4. The integrated tool of claim 1, the method further comprising:
    depositing the first liner to a thickness of approximately 5 angstroms to approximately 12 angstroms.

5. The integrated tool of claim 1, the method further comprising:
    depositing the second liner to a thickness of approximately 40 angstroms to approximately 60 angstroms.

6. The integrated tool of claim 1, the method further comprising:
    reflowing the first metal material by depositing additional first metal material and performing a hydrogen gas anneal or by performing an anneal of the first metal material already deposited.

7. The integrated tool of claim 1, the method further comprising:
    depositing a second metal seed material on the first metal material prior to depositing the second metal material, the second metal seed material composed of at least the second metal material doped with manganese.

8. The integrated tool of claim 1, the method further comprising:
    depositing a third liner of a second nitride material into the at least one wider than 1X feature after reflowing the first metal material, the third liner has a thickness of approximately 5 angstroms to approximately 10 angstroms.

9. The integrated tool of claim 1, the method further comprising:
    performing electroplating of the second metal material instead of depositing and reflowing the second metal material.

10. The integrated tool of claim 1, the method further comprising:
    etching the first metal material in the at least one wider than 1X feature after reflowing the first metal material.

11. The integrated tool of claim 1, the method further comprising:
    depositing a third liner of a second nitride material after etching and without an air break after etching.

12. The integrated tool of claim 11, wherein the first nitride material or the second nitride material is tantalum nitride or titanium nitride.

13. The integrated tool of claim 1, wherein one of the at least one 1X feature has a height different from one of the at least one wider than 1X feature.

14. The integrated tool of claim 1, wherein the first metal material is cobalt, ruthenium, molybdenum, nickel, rhodium, or iridium.

15. The integrated tool of claim 1, wherein the second metal material is copper or aluminum.

16. An integrated tool for performing semiconductor processing, the integrated tool, comprising:
    a set of process chambers of the integrated tool that are interconnected under vacuum and configured to form a dual metal interconnect structure, the dual metal interconnect structure including:
        at least one 1X feature formed with a first barrier layer with a thickness of approximately 5 angstroms to approximately 12 angstroms and filled with a conductive material having low diffusivity, high electromigration resistance, low scattering, and low resistivity at critical dimensions (CD) of approximately 15 nm or less, where X is a minimum feature width; and
        at least one 3X to 5X feature formed with the first barrier layer and partially filled with the conductive material used in forming the at least one 1X feature and filled with a copper-based material with low resistivity.

17. The integrated tool of claim 16, wherein the first barrier layer is tantalum nitride or titanium nitride and the conductive material is cobalt, ruthenium, or molybdenum.

18. The integrated tool of claim 16, wherein the at least one 3X to 5X feature has a second barrier layer formed by a tantalum nitride flash between the conductive material and the copper-based material, wherein the copper-based material is a copper manganese alloy.

19. An integrated tool for performing semiconductor processing, the integrated tool, comprising:
 a set of process chambers of the integrated tool that are interconnected under vacuum and configured to perform a set of processes of a method for creating a dual metal interconnect, the method including:
  depositing a first liner of a first nitride material into at least one 1X feature and at least one wider than 1X feature, the first liner has a thickness of 5 angstroms to approximately 12 angstroms, wherein X is a minimum feature width;
  depositing a second liner of a first metal material into the at least one 1X feature and at least one wider than 1X feature, wherein the second liner has a thickness of approximately 40 angstroms to approximately 60 angstroms;
  reflowing the first metal material such that the at least one 1X feature is filled with the first metal material and the at least one wider than 1X feature remains partially filled;
  depositing a second metal material on the first metal material; and
  reflowing the second metal material such that the at least one wider than 1X feature is filled with the second metal material.

20. The integrated tool of claim 19, the method further comprising:
 pre-cleaning the at least one 1X feature and the at least one wider than 1X feature prior to depositing the first liner;
 reflowing the first metal material by depositing additional first metal material and performing a hydrogen gas anneal or by performing an anneal of the first metal material already deposited;
 depositing a second metal seed material on the first metal material prior to depositing the second metal material, the second metal seed material composed of at least the second metal material doped with manganese;
 depositing a third liner of a second nitride material into the at least one wider than 1X feature after reflowing the first metal material, the third liner has a thickness of approximately 5 angstroms to approximately 12 angstroms;
 etching the first metal material in the at least one wider than 1X feature after reflowing the first metal material; or
 depositing a third liner of a second nitride material after etching and without an air break after etching.

* * * * *